United States Patent
Lee et al.

(10) Patent No.: US 6,391,119 B1
(45) Date of Patent: May 21, 2002

(54) METHOD FOR CLEANING PZT THIN FILM

(75) Inventors: June Key Lee, Suwon; Chang Jung Kim, Sungnam; Chung Il-Sub, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/348,477

(22) Filed: Jul. 7, 1999

(30) Foreign Application Priority Data

Jul. 7, 1998 (KR) .............................. 98-27305

(51) Int. Cl.[7] .............................. H01L 29/78
(52) U.S. Cl. .............................. 134/3; 134/41; 216/104; 252/79.3; 438/754; 438/3
(58) Field of Search ............ 134/3, 41; 216/101, 216/102, 103, 104; 438/3, 8, 16, 240, 396; 252/79.1, 79.2, 79.3, 79.4; 257/295

(56) References Cited

U.S. PATENT DOCUMENTS

| | | | | |
|---|---|---|---|---|
| 4,181,623 A | * | 1/1980 | Dillarstone et al. | 252/143 |
| 4,759,823 A | * | 7/1988 | Asselanis et al. | 156/659.1 |
| 5,258,093 A | * | 11/1993 | Maniar | 156/626 |
| 5,418,389 A | * | 5/1995 | Watanabe | 257/295 |
| 5,496,485 A | * | 3/1996 | Maternagham | 252/79.3 |
| 5,714,407 A | * | 2/1998 | Maeno et al. | 439/228 |
| 5,976,928 A | * | 11/1999 | Kirlin et al. | 438/240 |

OTHER PUBLICATIONS

Fabrication and Comparison of Ferroelectric Capacitor Structures for Memory Applications, Chee Won Chung, June Key Lee, et al., Integrated Ferroelectrics, 1997, vol. 16, pp. 139–147 (previously cited).

"Characterization and elimination of dry etching damaged layer in Pt/Pb($Zr_{0.53}Tl_{0.47}$)$O_3$/Pt ferroelectric capacitor", June Key Lee, et al., Applied Physics Letters, vol. 75, No. 3, Jul. 19, 1999, pp. 334–336.

Chee Won Chung, June Key Lee et al., Integrated Ferroelectrics, 1977, vol. 16, pp. 139–147 (to be provided).

* cited by examiner

Primary Examiner—Frankie L. Stinson
Assistant Examiner—Jiri Smetana
(74) Attorney, Agent, or Firm—Rothwell, Figg, Ernst & Manbeck

(57) ABSTRACT

A method for cleaning a PZT thin film using an etchant is provided. The method employs a combination of HF (or buffered oxide etchant (BOE)) and acetic acid, or a combination of HF(BOE), acetic acid and alcohol, as an etchant to thus reduce an etching rate of a PZT thin film, which is greatly dependent on the density of HF, thereby etching the PZT thin film to a finer dimension of thickness of 100Å or less using the etchant. Therefore, only secondary phase crystals or etching damaged layers on the surface of the PZT thin film can be eliminated.

3 Claims, 4 Drawing Sheets

METHOD FOR CLEANING PZT THIN FILM

BACKGROUND OF THE INVENTION

1. Field of the Invention

The present invention relates to a method for cleaning a lead zirconate titanate (PZT) thin film using an etchant.

2. Description of the Related Art

A PZT thin film is a thin film having La, Sr, Ca, Sc, Nb, Ta, Ni, Fe or Er added to $Pb(Zr_xTi_{1-x})O_3$. In manufacturing a semiconductor device such as a ferroelectric random access memory (FRAM) using the PZT thin film, the PZT thin film is degraded by various processes. According to the growth mechanism of a thin film, defects or components impediment to ferroelectric characteristics are concentrated on the surface of the PZT thin film. These materials are generally called a secondary phase materials, e.g., PbO or pyrochlore phase materials, which are paraelectric materials without ferroelectricity to thus degrade capacitor characteristics. Since the pyrochlore phase is thermodynamically weaker than a perovskite phase, it is liable to be damaged during integration, thereby accelerating degradation of capacitor characteristics. Also, during dry etching, layers damaged due to plasma are produced at the lateral surfaces of the PZT thin film. These layers directly connect an upper electrode and a lower electrode, and analysis thereof proves that they do not have crystallinity and the thicknesses thereof are 100 Å or less (please see Scanning Electron Micrograph (SEM) picture.) Also, they function as a leakage path due to their strong metallic characteristic.

FIG. 1 is a cross-sectional view of a ferroelectric capacitor manufactured by a conventional method without a cleaning process. As shown in FIG. 1, the conventional ferroelectric capacitor is constructed such that a PZT thin film 2 is formed on a lower electrode 1 and an upper electrode 3 is deposited on the PZT thin film 2 to then be etched in a predetermined dimension. Here, in the case of dry-etching the PZT thin film 2, a thin etching damaged layer 4 due to plasma remains on lateral surfaces of the PZT thin film 2, which increases leakage current.

SUMMARY OF THE INVENTION

To solve the above problems, it is an objective of the present invention to provide a method for cleaning a PZT thin film, which improves ferroelectric capacitor characteristics by eliminating secondary phase crystals or etching damaged layers from the top surface or lateral surface of the PZT thin film generated during manufacturing of the same.

To achieve the first objective of the present invention, there is provided a method for cleaning a PZT thin film using an etchant comprising the step of submerging a PZT thin film in an etchant in combination of HF and acetic acid to etch the surface of the PZT thin film.

In the present invention, alcohol may be further added to the etchant in combination of HF and acetic acid. Preferably, the alcohol is at least one selected from the group consisting of methanol, ethanol and propanol. Instead of alcohol, a polar solvent which is at least one selected from the group consisting of DMSO, DMF, dioxane, THF, NMP, pyridine, $CCl_3H$ and $CClH_3$ may be used.

BRIEF DESCRIPTION OF THE DRAWINGS

The above objectives and advantages of the present invention will become more apparent by describing in detail a preferred embodiment thereof with reference to the attached drawings in which:

FIGS. 2A and 2B illustrate a PZT thin film employing a PZT thin film cleaning method using an etchant according to the present invention, in which FIG. 2A is a cross-sectional view of the PZT thin film, and FIG. 2B is a cross-sectional view of a PZT thin film manufactured by actually applying the PZT thin film cleaning method thereto, taken by an SEM (Scanning Electron Microscope);

DESCRIPTION OF THE PREFERRED EMBODIMENTS

Figure 1:
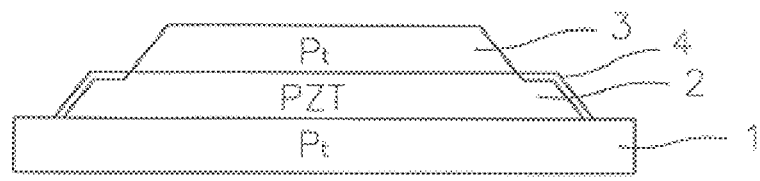
FIG. 1 is a cross-sectional view schematically showing a ferroelectric capacitor manufactured by a conventional method without a cleaning process.

Hereinbelow, a method for cleaning a PZT thin film according to the present invention will be described in detail with reference to accompanying drawings.

In the method for cleaning a PZT thin film according to the present invention, cleaning is performed after submerging the PZT thin film in an etchant in combination of the following solutions for a predetermined time (Hereinbelow, "cleaning" refers to removal of secondary phase crystals such as amorphous phase crystals, PbO or pyrochlore phase crystals, or etching damaged layers, by etching the same.) Here, the solutions used in the combination for the etchant are as follows:

1. HF per se or HF buffered solution prepared by adding a compound to HF ($HF+NF_4H$, $NF_4H$, $NF_2H_3$ and $NF_3H_2$);
2. Acetic acid; and
3. Alcohol.

These solutions are prepared by combination of HF+acetic acid or combination of HF+acetic acid+alcohol acetic acid+alcohol (or polar solvent). In practice, any combination of "Buffered Oxide Etchant(BOE)+acetic acid" or "BOE+acetic acid+alcohol" can be used, using BOE having HF as its main component, instead of HF per se. In these combinations of etchants, HF is used for removing Ti and Zr from PZT thin film components and acetic acid is used for removing Pb therefrom. As the alcohol solvent, methanol, ethanol or propanol can be used, by which the etching rate can be considerably reduced. Thus, an effect of cleaning rather than etching can be attained. Also, as the polar solvent which can be used as a dilute solvent instead of alcohol, at least one selected from the group consisting of DMSO (dimethyl sulfoxide), DMF (N,N-dimethylformamide), dioxane, THF (tetrahydrofuran), NMP (N-methyl pyrrolidone), pyridine, $CCl_3H$ and $CClH_3$ can be used.

Based on solubilities of oxides, as referenced in the CRC Handbook of Chemistry and Physics ($71^{st}$ Edition, 1990–1991, CRC Press), it is understood that PbO is soluble in acetic acid, nitric acid, hot alkali and the like, $ZrO_2$ is soluble to fluoric acid, chloric acid, nitric acid, sulfuric acid and the like, and $TiO_2$ is soluble to sulfuric acid, fluoric acid, alkali and the like. Therefore, in order to dissolve PZT, it is necessary to mix solvents capable of dissolving the respective metal oxides. Based on this fact, cleaning of the PZT thin film was performed using all solvents described above. As a result, the PZT thin film was instantly dissolved in the combination of etchants or reacted therewith to be recrystallized in the form of salts on the PZT thin film. Thus, it is found that both HF and acetic acid must be contained in an etchant for the purpose of dissolving PZT. However, since such an etchant exhibits too high a dissolution speed of PZT, it is difficult to employ the etchant for use in cleaning. In order to reduce the speed of PZT being dissolved, the densities of the etchants were reduced by adding water thereto. However, the dissolution speed was still high so as not to be controllable and the morphology was spoiled. Here, a known characteristic phenomenon was that the etching rate of PZT is greatly dependent on the density of HF. In order to reduce activity of HF, when HF was mixed with acetic acid which is an organic solution, instead of an aqueous solution, an etching rate thereof moderate enough to be controllable was attained. However, the density of HF used was too small. Thus, in order to compensate for the small amount of HF, BOE (Buffered Oxide Etchant) of $HF+NH_4F$ was used. When the volume ratio of acetic acid to BOE (6.6%) was 95 to 5, the etching rate of PZT ($PbZr_{0.52}Ti_{0.48}O$) was about 80 Å/min. Since the etching damaged layer must be etched as much as 100Å, it is very important to control the etching rate precisely. In case of using water as a solvent, that is, in case of the combination of water/acetic acid/BOE (6.6%), the etching rate was very large, that is, 5000Å/min or less. When methanol was used as a solvent in the range of the volume ratio of methanol to acetic acid to BOE (6.6Å%) being 85 to 10 to 5, the etching rate was 80Å/min. When ethanol having a relatively strong organic property was used in the range of the volume ratio of ethanol to acetic acid to BOE (6.6%) being 85 to 10 to 5, a low etching rate of 25Å/min was attained. Therefore, it was concluded that the combination of ethanol+acetic acid+BOE was actually most suitable for cleaning. As described above, the method for cleaning the PZT thin film can be applied to different ferroelectric thin films such as $SrBi_2Ta_aO_9$ and the like.

Next, embodiments of the method for cleaning a PZT thin film according to the present invention will be described.

First Embodiment

When a thin film on which secondary phase crystals and PZT are mixed was submerged in the following solutions for 4 minutes, the thickness of the etching damaged layer removed was about 100Å, whereas that of the secondary phase crystal removed was about 200Å or more.

Solutions used in combination of etchants are as follows: 1.5 ml of BOE (HF 6.6%); 2.10 ml of acetic acid; and 3.85 ml of ethanol.

Second Embodiment

Figure 2A:
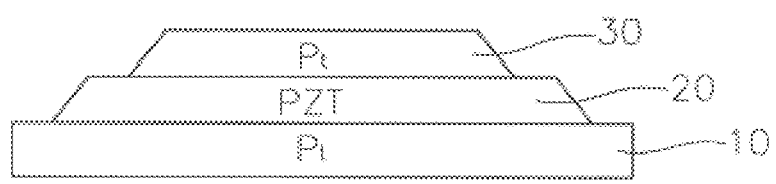
Figure 2B:
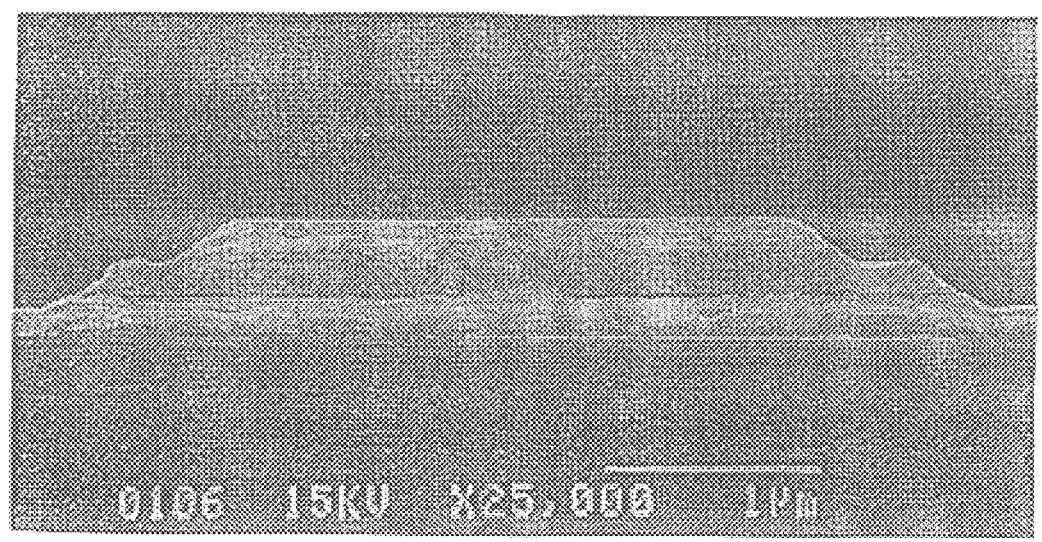
Figure 3A:
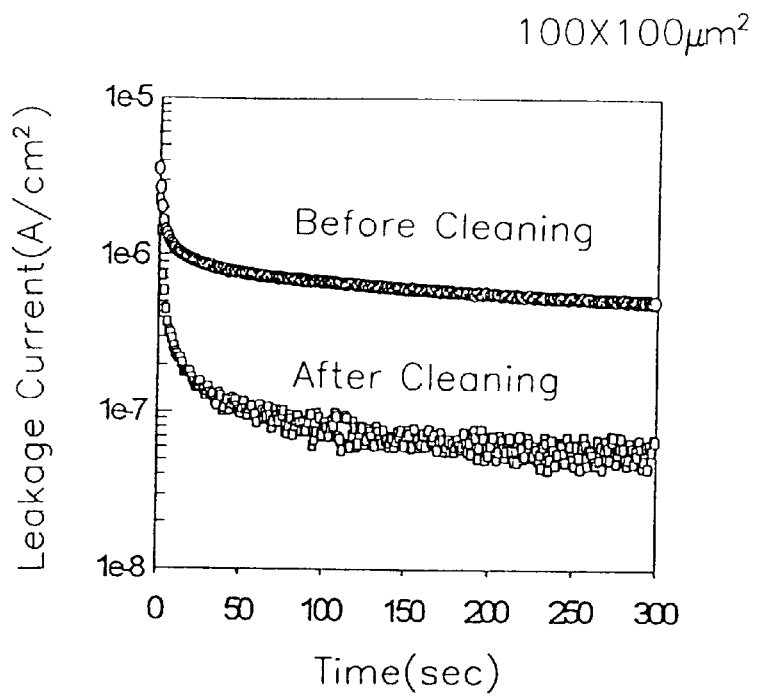
FIGS. 3A and 3B are graphs showing leakage currents before and after cleaning the PZT thin film shown in FIG. 2A.
Figure 3B:
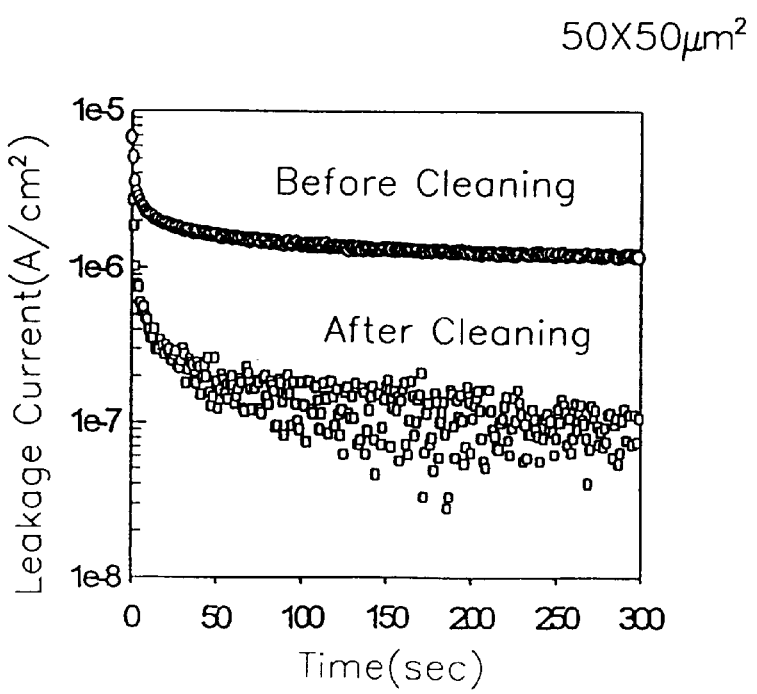

FIG. 2B is a cross-sectional view of a PZT capacitor for use in a ferroelectric memory device, after processing. In order to obtain the PZT capacitor as shown in FIG. 2, dry etching was performed. Here, the etching damaged layer in which PZT crystallinity is broken existed at side walls of the PZT capacitor due to a dry etching damage, which caused leakage current, thereby degrading device characteristics. A dry-etched PZT capacitor was submerged in a mixed solution of ethanol, acetic acid and BOE (6.6%) in the ratio of 85:10:5, for 4 minutes, to then remove a dry-etching damaged layer having a thickness of about 100Å. Then, as shown in FIGS. 3A and 3B, the leakage current was noticeably reduced by an order or higher, compared to that before cleaning.

Third Embodiment

Figure 4:
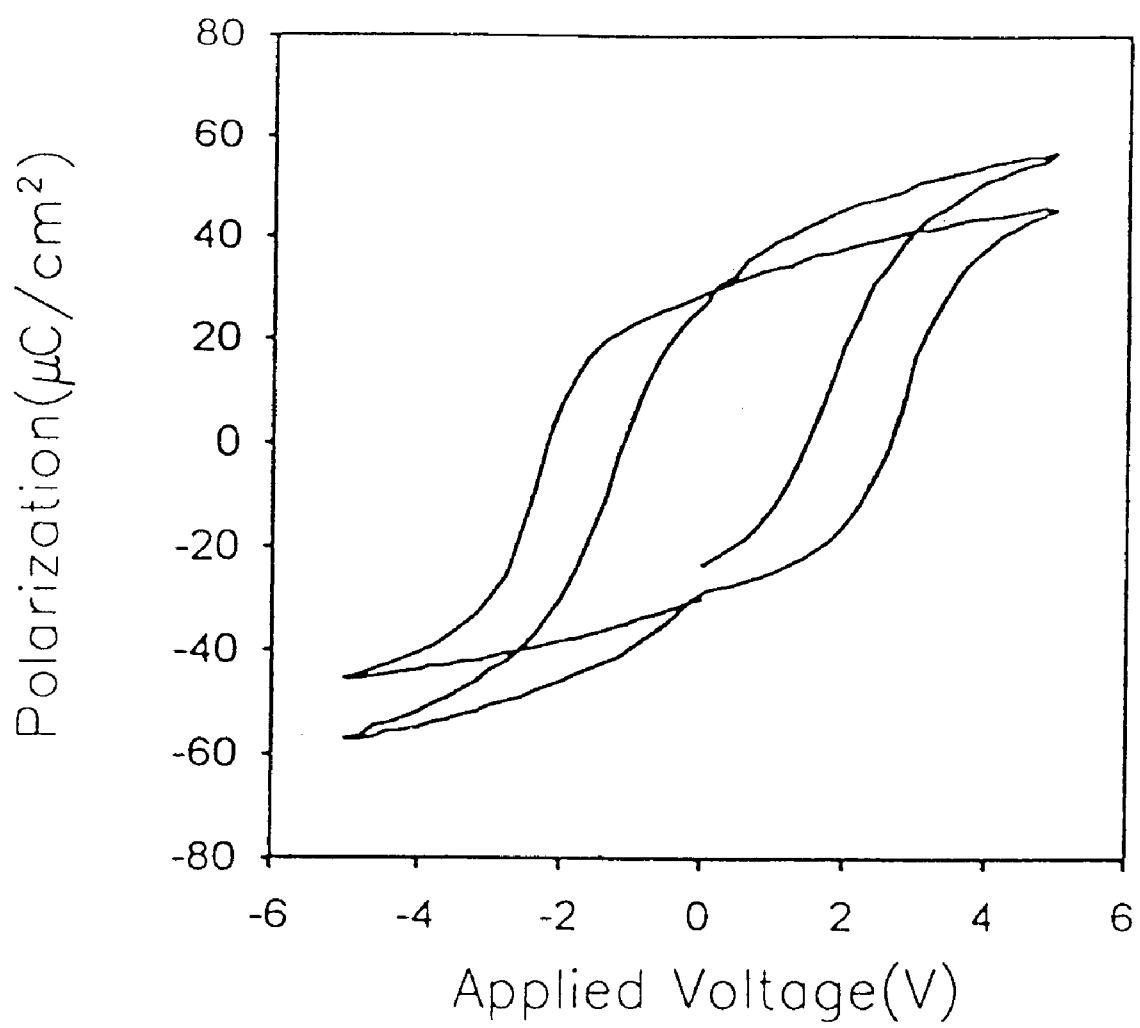
FIG. 4 is a graph showing polarization when the PZT thin film cleaning method according to the present invention is applied to the PZT thin film shown in FIG. 1.

The capacitor structure shown in FIG. 2A, as described by Chee Won Chung, June Key Lee, et al. in Integrated Ferroelectrics, 1977, Vol. 16, pp. 139–147, is imperative to high integration. However, during dry etching of the PZT thin film, the PZT thin film is subjected to damage. Such damage cannot be recovered by just thermally treating at a high temperature. Instead, the damaged layer was submerged in a mixed solution of ethanol, acetic acid and BOE (6.6%) in a ratio of 85:10:5, for 5 minutes. Then, as shown in FIG. 4, the original ferroelectric characteristics could be obtained.

Figure 5A:
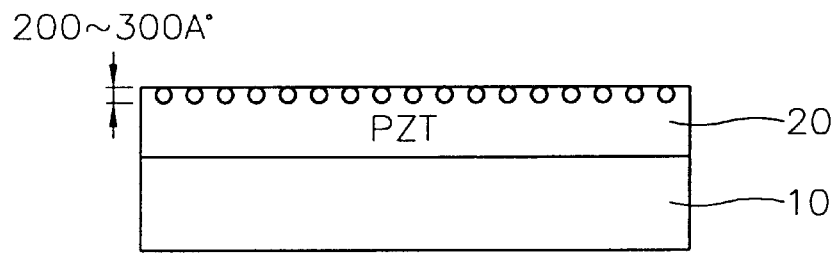
FIGS. 5A through 5C are cross-sectional views illustrating the sequence of a PZT thin film cleaning method according to the present invention.
Figure 5B:
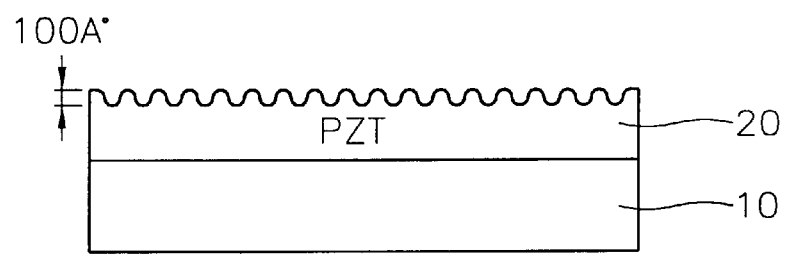
Figure 5C:
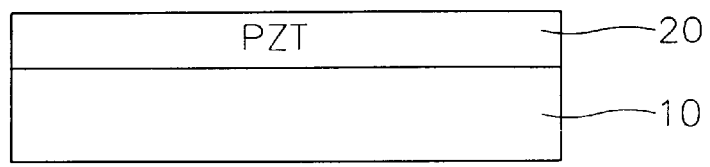

The experimental results showed that a cleaning process in manufacturing a PZT thin film was preferably performed in such a manner as described in FIGS. 5A through 5C.

First, as shown in FIG. 5A, a PZT thin film 20 is deposited on a lower electrode 10. Then, a secondary phase crystal layer having a thickness of about 200~300Å remains on the surface of the PZT thin film 20. The resultant structure is cleaned by submerging the same in the mixed solution for cleaning, as in the above-described embodiments. Then, as shown in FIG. 5B, an etching damaged layer having a thickness of about 100Å is left. The etching damaged layer is submerged in the mixed solution for cleaning. Then, a clean PZT thin film, as shown in FIG. 5C, can be obtained. An upper electrode is deposited on the obtained PZT thin film, thereby attaining a ferroelectric capacitor whose ferroelectric characteristics are not impaired.

As described above, in the PZT thin film cleaning method according to the present invention, a combination of HF (or BOE) and acetic acid, or a combination of HF(BOE), acetic acid and alcohol, was used as an etchant, to thus reduce the etching rate of a PZT thin film, which is greatly dependent on the density of HF, thereby etching the PZT thin film to a finer dimension of thickness of 100Å or less using the etchant. Therefore, only secondary phase crystals or etching damaged layers on the surface of the PZT thin film can be eliminated. As a result, a PZT thin film whose characteristics are not impaired can be attained.

What is claimed is:

1. A method for cleaning a PZT thin film using an etchant comprising the step of submerging a PZT thin film in an etchant, wherein the etchant is a combination of HF and acetic acid, and adding a dilute solvent consisting of alcohol only, wherein said alcohol is selected from the group consisting of methanol, ethanol and propanol, in an amount effective to reduce the etching rate of the HF and acetic acid for cleaning.

2. A method for cleaning a PZT thin film using an etchant comprising the step of submerging a PZT thin film in an etchant, wherein the etchant is a combination of HF and acetic acid, and adding a dilute solvent in an amount effective to reduce the etching rate to about 25Å/minute.

3. A method for cleaning a PZT thin film using an etchant comprising the step of submerging a PZT thin film in an etchant, wherein the etchant is a combination of HF and acetic acid, and adding a dilute solvent in an amount effective to reduce the etching rate of the HF and acetic acid for cleaning, wherein said step of adding a dilute solvent includes adding alcohol to the etchant combination of HF and acetic acid to etch the PZT thin film, wherein the volume ratio of alcohol to the etchant combination of HF and acetic acid is about 85:15.

* * * * *